(12) United States Patent
Saitoh et al.

(10) Patent No.: US 7,492,799 B2
(45) Date of Patent: Feb. 17, 2009

(54) LIGHT-EMITTING ELEMENT DRIVER

(75) Inventors: Mitsuyori Saitoh, Itabashi-ku (JP); Hiroshi Watanabe, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/555,502

(22) Filed: Nov. 1, 2006

(65) Prior Publication Data
US 2007/0098027 A1 May 3, 2007

(51) Int. Cl.
*H01S 5/062* (2006.01)
(52) U.S. Cl. .............. 372/38.02; 372/38.01; 372/38.07; 372/29.011
(58) Field of Classification Search .............. 372/38.01, 372/38.02, 38.07, 29.011
See application file for complete search history.

(56) References Cited

U.S. PATENT DOCUMENTS

| 3,947,853 | A | * | 3/1976 | Denny et al. | 347/76 |
| 6,198,497 | B1 | * | 3/2001 | Luque | 347/247 |
| 6,560,256 | B1 | * | 5/2003 | Seki et al. | 372/38.02 |
| 2001/0046243 | A1 | * | 11/2001 | Schie | 372/38.02 |
| 2003/0035451 | A1 | * | 2/2003 | Ishida et al. | 372/38.02 |
| 2004/0257839 | A1 | * | 12/2004 | Yang et al. | 363/21.12 |

* cited by examiner

*Primary Examiner*—Minsun Harvey
*Assistant Examiner*—Michael Carter
(74) *Attorney, Agent, or Firm*—William B. Kempler; W. James Brady, III; Frederick J. Telecky, Jr.

(57) ABSTRACT

The bias current of a current injection-type light-emitting element is set very close to the threshold current, and to guarantee a stable optical output and high-speed initiation of the light-emitting operation. In the bias current supply circuit 12, particularly in closed-loop circuit 20, feedback operation of bias APC with variable bias current $I_b$ is performed so that monitor voltage $V_{M1}$ comes to equal reference voltage $V_{A1}$. With this feedback operation, the steady state of $V_{M1}=V_{A1}$ is reached, and drive current $I_b$ ($I_{ba}+I_{bb}$) sent to laser diode 10 converges to a constant value. After a prescribed time, S/H circuit 34 is switched to hold mode. As a result, drive current $I_b$ ($I_{ba}+I_{bb}$) is temporarily held to a constant value corresponding to the prescribed optical output.

19 Claims, 4 Drawing Sheets

LIGHT-EMITTING ELEMENT DRIVER

FIELD OF THE INVENTION

The present invention pertains to a light-emitting element driver. More specifically, the present invention pertains to a circuit for driving a current injection type light-emitting element whose threshold current value lies within the current-optical output characteristics.

BACKGROUND OF THE INVENTION

It is well known that the laser diode is a typical example of a current injection type light-emitting element. When a forward drive current flows in through the laser diode, electrons and holes recombine to generate photons in the region of the active layer, and the spontaneously emitted light is fed back and forth in the active layer to generate laser oscillation (stimulated emission). As shown in FIG. 7, the drive current-optical output characteristic curve of the laser diode contains an inflection point called the oscillation threshold or threshold current $I_{TH}$. When a drive current higher than said threshold current $I_{TH}$ is supplied (injected), laser oscillation (light emission) occurs, so that the optical output can be controlled and adjusted easily and at high speed.

One application of the laser diode is its use in printing heads. A laser system used in a printing head has a constitution in which the beam spot of the laser beam generated at a prescribed dot period from the laser diode is scanned over the photosensitive drum in the line direction (principal scanning direction). In this case, the laser diode generates a high-speed pulsed optical output in response to a high-speed pulsed signal.

In order for the laser diode to emit light, it is necessary to increase the drive current from zero; when the drive current exceeds theoretical current $I_{TH}$, laser oscillations (light emission) are initiated. However, there exists a delay time for the drive current to reach threshold current $I_{TH}$. In applications in which the laser diode is driven with high-speed pulses, a DC bias current set near the threshold current $I_{TH}$ is injected into the laser diode. During the pulse period, a constant switching current that rides on the bias current is supplied (injected), and the optical output of the laser diode increases rapidly, following the switching current. In this case, corresponding to the drive current versus optical output characteristics, an optical output is obtained corresponding to the drive current or the sum of the bias current and the switching current.

However, since the bias current is fixed, if the drive current versus optical output characteristics of the laser diode vary due to changes in ambient temperature and other changes over time, an offset between the bias current and threshold current $I_{TH}$ can occur, and as the offset becomes larger, problems arise. That is, when threshold current value $I_{TH}$ changes to larger value than the bias current, a delay takes place for the start of laser oscillation after injection of the switching current, or the delay becomes longer. On the other hand, when threshold current $I_{TH}$ changes to a smaller value than the bias current, even when the switching current is not injected, light will be generated all the time, although it is weak.

In order to solve the problems of the aforementioned fixed bias method, the following scheme has been proposed: the drive current versus optical output characteristics of the laser diode is represented using a linear approximation to compute the theoretical value of threshold current $I_{TH}$, and the current value obtained by extrapolating back from a prescribed value is used as the bias current in the variable bias method. In this variable bias setting method, a plurality of operating points (usually 2) on the drive current versus optical output characteristics are measured, and the point of intersection of the straight line defined by said two operating points to the abscissa (current axis) with optical output of zero is determined. The current at the point of intersection is used as the theoretical threshold current value $I_{TH}$. Even when the drive current versus optical output characteristics of the laser diode varies, it is still possible to automatically reset or update the bias current tracking said variation.

However, the drive current versus optical output characteristics of the laser diode are not strictly a straight line even in the oscillation region where the current exceeds threshold current $I_{TH}$. In said conventional variable bias setting method, because the aforementioned nonlinear characteristic curve is approximated by a straight-line fit, the precision of determining threshold current $I_{TH}$ determined on the basis of this theory is reduced, and thus the precision of determining the bias current is also reduced.

In addition, according to the aforementioned variable bias setting method, in order to determine plural points on the drive current versus optical output characteristic curve, it is necessary to perform at least two cycles of operation for the operating mode in setting the bias current by measuring the current value corresponding to the optical output at a prescribed value as the laser diode is temporarily turned on. This leads to a significant restriction on the applications. That is, in order to keep a constant optical output at the normal operating point with respect to variation in the drive current versus optical output characteristics of the laser diode, it is necessary to reset not only the bias current but also the switching current. Consequently, after the operation for setting the bias current, it is necessary to perform an operation for setting the switching current that establishes the switching current for obtaining the nominal operating point as the laser diode is temporarily driven under a new bias current. Thus, it is necessary to perform a total of three or more cycles of operation in the operating mode (temporary driving) for resetting the bias current and the switching current. However, for printing heads with laser systems, the times that said resetting mode can be used are limited to the scanning period (such as the flyback line period), and if the time needed for the resetting mode becomes longer, it becomes impossible to use either method, or the number of executions must be reduced.

In addition, for the light-emitting element driver on the basis of the aforementioned variable bias setting method, there should be not only a complicated analog operation circuit for determining the theoretical threshold current and bias current using the straight line approximation method, but also special current generating circuit which is different from the bias current supply circuit used in the bias current setting mode, for generating the bias current determined in another operation. As a result, the circuit scale is very large, which is undesirable.

A general object of the present invention is to solve the aforementioned problems of the prior art by providing a light-emitting element driver characterized by the fact that the bias current is automatically set very near the threshold current of the current injection type light-emitting element, and it can guarantee a stable optical output and high-speed initiation of the light-emitting operation.

SUMMARY OF THE INVENTION

This and other objects and features are provided in accordance with one aspect of the present invention by a light-emitting element driver comprising the following parts: a light-receiving element for converting the optical output of the light-emitting element into a current; a first monitor voltage generator that generates a first monitor voltage with a magnitude equal to the product of the current flowing through said light-receiving element and a first coefficient; a first closed-loop circuit that feeds the first current to said light-emitting element such that said monitor voltage becomes equal to the first reference voltage corresponding to the first optical output reference value selected for setting the bias current for said light-emitting element; a second monitor voltage generator that generates a second monitor voltage with a magnitude equal to the product of the current flowing in said light-receiving element and a second coefficient; and a second closed-loop circuit that feeds the second current to said light-emitting element such that said second monitor voltage becomes equal to the second reference voltage corresponding to the second optical output reference value selected for setting the switching current of said light-emitting element.

In said constitution, the feedback operation may be performed with said first monitor voltage generator and the first closed-loop circuit, and the desired bias current is set on the basis of the first current obtained in the steady state when the first monitor voltage becomes equal to the first reference voltage. In addition, another feedback operation is performed with the second monitor voltage generator and the second closed-loop circuit, and the desired switching current is set on the basis of the second current for obtaining the steady state when the second monitor voltage becomes equal to the second reference voltage.

A feature of the present invention, in the first mode for setting said bias current, said second closed-loop circuit is turned off and said first closed-loop circuit is used to perform a feedback operation, and the difference obtained by subtracting a prescribed proportion of the offset portion from said first current that reaches the steady state in said first closed-loop circuit is held as said bias current. Consequently, what is obtained by subtracting the offset portion at a prescribed proportion from the first current (temporary bias current) that reaches the steady state is held as the actual bias current, so that it is possible to represent the actual threshold current by a better approximation.

A feature of the first closed-loop circuit in this case, said first closed-loop circuit comprises the following parts: a first comparator that compares said monitor voltage to said first reference voltage and generates an error voltage corresponding to the difference between them, a first sample-and-hold circuit that samples and holds the error voltage from said first comparator, a first bias current component generator that generates a first bias current component corresponding to the output voltage of said first sample-and-hold circuit, a second bias current component generator that generates a second bias current component corresponding to the output voltage of said first sample-and-hold circuit, and a first current adder that adds said first bias current component and said second bias current component to generate said first current; wherein in said first mode, when said feedback operation is performed, said first sample-and-hold circuit is switched to the sampling mode, and when said feedback operation is stopped, said first sample-and-hold circuit is switched to the hold mode; after said feedback operation is stopped, the sourcing of said second bias current component from said second bias current component generator to said first current adder is cut off.

In addition, said first closed-loop circuit can comprise the following parts: a third transistor that has one terminal connected to the first reference power source's voltage terminal and has the other terminal connected to the first node, a first feedback resistor connected between the first node and the second reference power source's voltage terminal for flowing of said first bias current component, a second feedback resistor connected in parallel with said first feedback resistor and between said first node and the second reference power source's voltage terminal for flowing of said second bias current component, an on/off switch connected in series with said second feedback resistor between said first node and said second reference power source's voltage terminal, a differential amplifier, which has a first input terminal connected to the output terminal of said first sample-and-hold circuit, a second input terminal connected to said first node, and the control terminal of said third transistor, and which amplifies the difference between the output voltage of said first sample-and-hold circuit and the node voltage obtained at said first node, and a fourth transistor that is composed of said third transistor and a current mirror circuit and is connected in series with said light-emitting element. In this case, said first bias current component generator is composed of said third transistor, said first feedback resistor, and said differential amplifier; said second bias current component generator is composed of said third transistor, said second feedback resistor and said differential amplifier; wherein, in said first mode, when said feedback operation is performed, said switch is turned on; and, in said first mode, when said feedback operation is not performed, said switch is turned off. In this way, even in the case of offset from the temporary bias current established in the steady state using the feedback operation to the actual bias current that can be better approximated by the actual threshold current, one may simply turn off the switch, and there is no need to perform any computing processing operation.

In another feature, in the second mode for setting said switching current performed after end of said first mode, while said bias current is fed in the hold state by said first closed-loop circuit, a feedback operation is performed with said second closed-loop circuit, and the current that reaches the steady state in said second closed-loop circuit is held as said switching current. It is preferred that setting be performed after setting of the bias current. Consequently, the sum of the bias current that has been set immediately beforehand and the switching current is fed as the second current to the light-emitting element, and the current that reaches the steady state in the second closed-loop circuit is held, so that it is possible to determine the drive current (bias current+ switching current) for emitting light with the second optical output reference value in the light-emitting element.

In another feature, in the third mode when said light-emitting element is driven to emit light after the end of said second mode, said bias current from said first closed-loop circuit in the hold state is continuously supplied to said light-emitting element, and said switching current from said second closed-loop circuit in the hold state is added to said bias current corresponding to the prescribed input signal, and the sum of these currents is supplied to said light-emitting element. The light-emitting element is set in standby state immediately before light emission since only the bias current is used for driving during the period when no switching current is supplied. During the period when the switching current is supplied, driving is performed by means of the sum current obtained by adding the switching current to the bias current, and light emission is performed with an optical output with the same reference value (the second optical output reference value) as that in setting the switching current.

As another feature, said first monitor voltage generator comprises a first monitor resistor through which flows a current identical to that flowing through said light-receiving element, or a current proportional to said current with a first ratio (preferably one or more), and said first monitor voltage is extracted. In a preferred scheme, said first monitor voltage generator has a first transistor connected in series with said light-receiving element, and a second transistor that together with said first transistor forms a current mirror circuit with a current mirror ratio corresponding to said first ratio, and said first monitor resistor and said second transistor are connected in series.

In another feature, said second monitor voltage generator comprises a second monitor resistor through which flows the same current as that which flows through said light-receiving element, or a current proportional to said current at the second ratio (preferably one) flowing through it, and from said second monitor resistor, said second monitor voltage is extracted. In a preferred scheme, said second monitor voltage generator has a fifth transistor connected in series with said light-receiving element, and a second transistor that together with said fifth transistor forms a third current mirror circuit with a current mirror ratio corresponding to said second ratio, and said second monitor resistor and said second transistor are connected in series.

According to one aspect of the present invention, by appropriate selection of the current mirror ratio, the resistance of the monitor resistor and the first and second reference voltages in the current mirror circuits in the first and second monitor voltage generators, the ratio of the first optical output reference value to the second optical output reference value can be minimized, and the first optical output reference value can asymptotically approach zero. This means that the bias current obtained in the feedback operation in the first closed-loop circuit can be made near the actual threshold current limitlessly.

In another feature, said second closed-loop circuit comprises a second comparator that compares said monitor voltage to said second reference voltage and generates an error voltage corresponding to the difference between them, a second sample-and-hold circuit that samples and holds the error voltage from said second comparator, and a switching current generator that generates a switching current corresponding to the output voltage of said second sample-and-hold circuit; in said second mode, when said feedback operation is performed, said second sample-and-hold circuit is switched to the sampling mode, and when said feedback operation is not performed, said second sample-and-hold circuit is switched to the hold mode.

In another feature of the present invention, the light-emitting element driver comprises a switch for selective connection of said light-receiving element to said first or second monitor voltage generator. In the present invention, said light-emitting element is typically a laser diode. It is preferred that all of said transistors be bipolar transistors.

REFERENCE NUMERALS AND SYMBOLS AS SHOWN IN THE DRAWINGS

In the figures, 10 represents a laser diode; 12 represents a bias current supply circuit; 14 represents a switching current supply circuit; 16 represents a current adder; 18, 42 represent monitor voltage generators; 20, 44 represent closed-loop circuits; 22 represents a photodiode; 24, 46 represent current mirror circuits; 26, 48 represent monitor resistors; 28, 30, 50, 52, 62, 64 represent PNP transistors; 32, 54 represent comparators; 34, 56 represent sample-and-hold (S/H) circuits; 36, 38, 58 represent voltage-current converters; 66, 68 represent feedback resistors; 70 represents an on/off switch; 72 represents a differential amplifier.

DESCRIPTION OF THE EMBODIMENTS

For the light-emitting element driver of the present invention, the circuit constitution can detect the threshold current of the current injection-type light-emitting element with great precision, and the bias current can be automatically set very close to the threshold current in a short time, and a stable optical output and high-speed initiation of the light-emitting operation can be guaranteed.

Preferred Embodiment of the Present Invention

In the following, an explanation will be given regarding a preferred embodiment of the present invention with reference to FIGS. 1-6.

Figure 1:
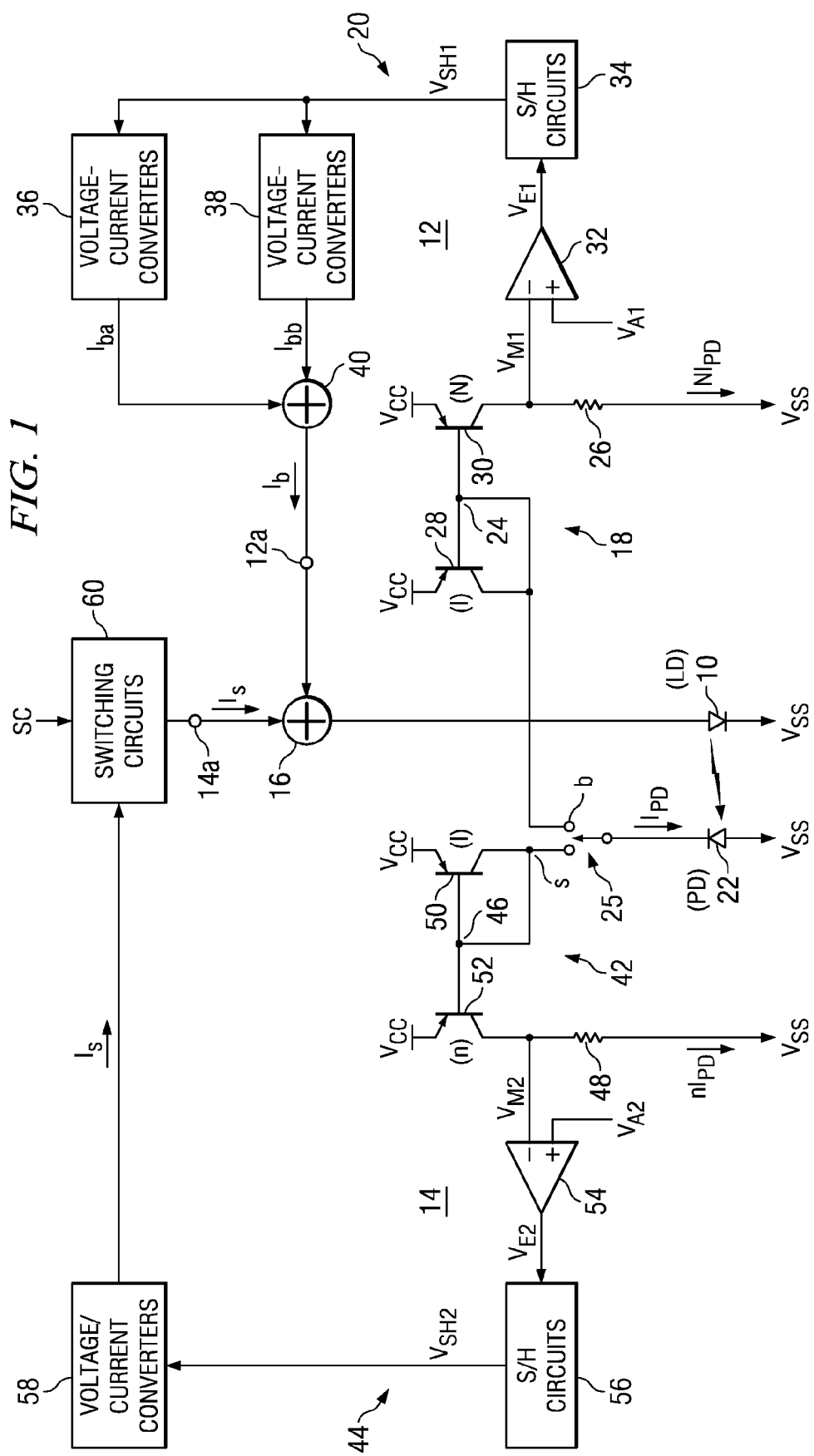
FIG. 1 is a diagram illustrating a circuit constitution of the light-emitting element driver in an embodiment of the present invention.

FIG. 1 is a diagram illustrating the circuit constitution of the light-emitting element driver in an embodiment of the present invention. This light-emitting element driver drives laser diode (LD) 10, and comprises bias current supply circuit 12 and switching current supply circuit 14 for supplying DC bias current $I_b$ and pulse-shaped switching current $I_s$, respectively, to said laser diode 10.

The cathode of said laser diode 10 is grounded. The cathode terminal of this laser diode is connected to the negative power source voltage terminal $V_{ss}$. Output terminals 12a, 14a of bias current supply circuit 12 and switching current supply circuit 14 are connected via current adder 16 to the anode terminal.

Said bias current supply circuit 12 includes monitor voltage generator 18 that works only in the bias current setting mode, and closed-loop feedback circuit 20 that can be selectively switched between the active state and the hold state. Said closed-loop circuit 20 contains circuits 36, 38 that generate bias current $I_b$.

Said monitor voltage generator 18 contains photodiode (PD) 22 that receives the light generated by laser diode 10, which is photoelectrically converted into a current corresponding to the optical intensity or optical output, current mirror circuit 24 that generates current $NI_{PD}$, that is, the product of current $I_{PD}$ flowing in said photodiode 22 and a prescribed ratio N (preferably N≧3), and monitor resistor 26 set in the output section of said current mirror circuit 24. More specifically, current mirror circuit 24 is composed of a pair of PNP transistors 28, 30. PNP transistor 28 on one side is connected in series with photodiode 22 via switch 25, and PNP transistor 30 on the other side is connected in series with monitor resistor 26. The resistance of monitor resistor 26 is denoted as $R_{26}$, and monitor voltage $V_{M1}$ is equal to $R_{26}*NI_{PD}$ from the terminal of monitor resistor 26. Also, in current mirror circuit 24, the emitter size ratio of PNP transistors 28, 30 is set to 1:N.

Closed-loop circuit 20 contains analog comparator 32 made from an operational amplifier, sample-and-hold circuit (S/H) 34, two voltage-current converters 36, 38, and current adder 40.

Monitor voltage $V_{M1}$ from monitor voltage generator 18 is input to the (inverting) input terminal of comparator 32, reference voltage $V_{A1}$ for bias current setting from the reference voltage generator (not shown in the figure) is input to the (non-inverting) input terminal, and error voltage $V_{E1}$ corresponding to the difference between the two input voltages $V_{M1}$ and $V_{A1}$ is output. S/H circuit 34 samples and holds output voltage $V_{E1}$ of comparator 32. Voltage-current converters 36, 38 generate currents $I_{ba}$, $I_{bb}$ corresponding to output voltage $V_{SH1}$ of S/H circuit 34, respectively. Here, current $I_{ba}$ generated by voltage-current converter 36 is the main bias current component, and current $I_{bb}$ generated by voltage-current converter 38 is the auxiliary bias current. These currents are proportionally related in that $I_{bb}=KI_{ba}$ (here 0<K<1). Said current adder 40 adds said main bias current $I_{ba}$ and auxiliary bias current component $I_{bb}$, and the sum $(I_{ba}+I_{bb})$ is sent as bias current $I_b$ to one input terminal of current adder 16.

Said switching current supply circuit 14 contains monitor voltage generator 42 that operates only in the switching current setting mode, and closed-loop feedback circuit 44 that can selectively switch between the active state and the hold state. Said closed-loop circuit 44 contains a circuit that generates switching current $I_s$.

Said monitor voltage generator 42 contains current mirror circuit 46, which shares photodiode 22 with monitor voltage generator 18 on the side of bias current supply circuit 12 and which generates current $nI_{PD}$ proportional to current $I_{PD}$ flowing through said photodiode 22 with a prescribed ratio n (usually n=1), and monitor resistor 48 set in the output stage of said current mirror circuit 46. More specifically, current mirror circuit 46 is composed of a pair of PNP transistors 50, 52. PNP transistor 50 on one side is connected in series with photodiode 22 via switch 25, and PNP transistor 52 on the other side is connected in series with monitor resistor 48. If the resistance of monitor resistor 48 is $R_{48}$, monitor voltage $V_{M2}$, represented by $R_{48}*nI_{PD}$, is the voltage drop across the terminals of monitor resistor 48.

Said closed-loop circuit 44 contains analog comparator 54, sample-and-hold circuit (S/H) 56, voltage-current converter 58 and switching circuit 60.

Monitor voltage $V_{M2}$ from monitor voltage generator 42 is input to the (inverting) input terminal of said comparator 54, and reference voltage $V_{A2}$ for setting the switching current from a reference voltage generator (not shown in the figure) is input to the (non-inverting) input terminal of said comparator, which outputs error voltage $V_{E2}$ corresponding to the difference between said two input voltages $V_{M2}$ and $V_{A2}$. S/H circuit 56 samples and holds the output voltage $V_{E2}$ of comparator 54. Said voltage-current converter 58 generates switching current $I_s$ corresponding to output voltage $V_{SH2}$ of S/H circuit 56. Said switching circuit 60 is made up of a switching circuit that can switch on/off at a high frequency. Switching current $I_s$ is input from voltage-current converter 58, and corresponding to the desired input signal SC given as a binary signal or a pulse signal, when SC=H level, switching current $I_s$ is supplied to current adder 16, and when SC=L level, switching current $I_s$ is cut off.

Said current adder 16 contains a current driver and adds bias current $I_b$ from bias current supply circuit 12 and switching current $I_s$ from switching current supply circuit 14, and injects the sum $(I_b+I_s)$ as the laser drive current to laser diode 10.

Figure 2:
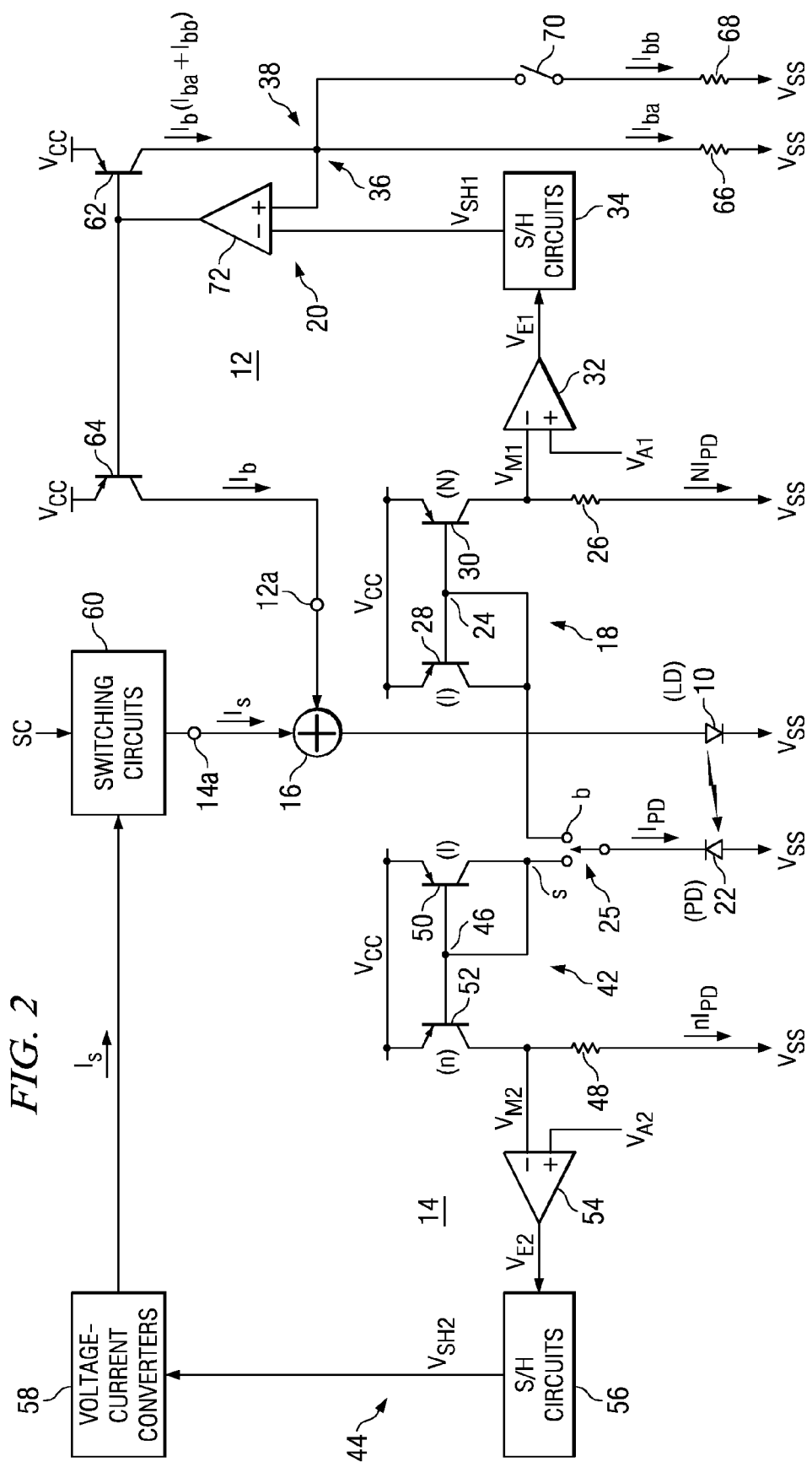
FIG. 2 is a diagram illustrating the specific circuit constitution of the light-emitting element driver in the embodiment.

FIG. 2 is a diagram illustrating the specific constitution of voltage-current converters 36, 38 and current adder 40 in bias current supply circuit 12. In this constitution example, the base terminals of a pair of PNP transistors 62, 64 are connected to each other to form a current mirror circuit. The emitter terminal of said PNP transistor 62 is connected to the positive terminal of power source $V_{cc}$, and the collector terminal is connected to node ND. Two feedback resistors 66, 68 are connected in parallel between node ND and the negative terminal of power source Vss. On/off switch 70 is connected in series with resistor 68. The output terminal of S/H circuit 34 is connected to the (inverting) input terminal of differential amplifier 72, consisting of an op amp, and node ND is connected to the (non-inverting) input terminal. The output terminal of differential amplifier 72 is connected to the base terminal of PNP transistor 62. The emitter terminal of PNP transistor 64 is connected to the positive terminal of power source $V_{cc}$, and the collector terminal is connected via output terminal 12a of bias current supply circuit 12 to one input terminal of current adder 16.

Said voltage-current converter 36 is composed of PNP transistor 62, resistor 66 and differential amplifier 72. Said voltage-current converter 38 is composed of PNP transistor 62, resistor 68 and differential amplifier 72. Said current adder 40 is made of node ND. Also, the current mirror ratio of said current mirror circuits 62, 64 is usually 1:1.

In said light-emitting element driver, the switching state of switch 25, S/H circuits 34, 56 and voltage-current converter 38 (switch 70) are controlled by a controller (not shown in the figure). That is, switch 25 is switched to the side of terminal b when photodiode 22 is connected to monitor voltage generator 18 on the side of bias current supply circuit 12, and to the side of terminal s when photodiode 22 is connected to monitor voltage generator 42 on the side of switching current supply circuit 14. As will be explained below, S/H circuit 34 is switched to sampling mode when the feedback operation of bias APC (auto-bias control) is performed by closed-loop circuit 20, and to hold mode when the feedback operation of bias APC comes to an end. As will be explained below, S/H circuit 56 is switched to sampling mode when the feedback operation of switching APC is performed by closed-loop circuit 44, and to hold mode when the feedback operation of switching APC is finished. Said voltage-current converter 38 (switch 70) is switched to the active state (switch on) when the feedback operation of bias APC is executed, and it is switched to the non-active state (switch off) when the feedback operation of bias APC is finished. Also, reference voltages $V_{A1}$, $V_{A2}$ supplied to comparators 32, 54 can be set to any value by means of the controller.

In the following, an explanation will be given regarding the operation of the light-emitting element driver. In the light-emitting element driver, there are the following three modes: bias current setting mode, switching current setting mode, and normal light-emitting mode. In the following, an explanation will be given regarding the operation of the various modes.

The bias current setting mode is used to set or reset bias current $I_b$ with respect to laser diode 10 on the side of bias current supply circuit 12. When this mode is executed, switch 25 is turned to the side of terminal b, and photodiode 22 is connected to monitor voltage generator 18 on the side of bias current supply circuit 12. In order to turn off switching current supply circuit 14, switching circuit 60 may be forcibly kept in the off state.

In order to start the bias current setting mode, while S/H circuit 34 is switched to sampling mode, on/off switch 70 of voltage-current converter 38 is turned on. Bias current $I_b$ from bias current supply circuit 12 is fed (injected) as a drive current to laser diode 10, and light is emitted from laser diode 10. When this light is received by photodiode 22, photocurrent $I_{PD}$ flows through it. Photocurrent $I_{PD}$ of photodiode 22 is converted by monitor voltage generator 18 to monitor voltage $V_{M1}$ represented by $R_{26}*NI_{PD}$. Then, corresponding to the difference between said monitor voltage $V_{M1}$ and reference voltage $V_{A1}$, error voltage $V_{E1}$ is output from comparator 32, and it is sampled by S/H circuit 34. Differential amplifier 72 receives sampling voltage $V_{SH1}$ of S/H circuit 34 at its inverting input terminal, and since PNP transistor 62 is on to close the feedback loop, this same sampling voltage $V_{SH1}$ appears at the non-inverting input (the voltage at node ND). Because on/off switch 70 of voltage-current converter 38 is on, collector current $I_b$ from PNP transistor 62 branches between resistor 66 on the side of voltage-current converter 36 and resistor 68 on the side of voltage-current converter 38. That is, collector current $I_b$ of PNP transistor 62 is the sum of current $I_{ba}$ flowing through resistor 66 and current $I_{bb}$ flowing through resistor 68. Here, current $I_{ba}$ flowing through resistor 66 is the main bias current, and current $I_{bb}$ flowing through resistor 68 is the auxiliary bias current. Also, in PNP transistor 64, collector current $I_b$ ($I_{ba}+I_{bb}$) has the same magnitude as the laser drive current.

In this way, in bias current supply circuit 12, especially, in closed-loop circuit 20, feedback operation of bias APC is performed with variable bias current $I_b$ such that monitor voltage $V_{M1}$ is equal to reference voltage $V_{A1}$. Due to this feedback operation, at steady state $V_{M1}=V_{A1}$, and the drive current $I_b$ ($I_{ba}+I_{bb}$) sent from bias current supply circuit 12 to laser diode 10 converges to a constant value. In this way, as S/H circuit 34 is switched to hold mode at a prescribed time after the start of bias APC mode, drive current $I_b$ ($I_{ba}+I_{bb}$) is held at a constant value corresponding to prescribed optical output $P_b$, to be explained below.

If the optical output of laser diode 10 is $P_b$ and photocurrent $I_{PD}$ of bias current supply circuit 12 is $I_{PDb}$ when the feedback operation of bias APC reaches steady state, Equation 1 is established. Here, α is a proportionality constant.

$$P_b = \alpha * I_{PDb} \quad (1)$$

Also, as will be explained below, at steady state, $V_{M1}=V_{A1}$, from which follows Equation 2:

$$V_{A1} = V_{M1} = R_{26} * NI_{PDb} \quad (2)$$

Equation 3 follows from said Equations 1, 2.

$$P_b = \alpha * I_{PDb} = \alpha * V_{A1} / (N * R_{26}) \quad (3)$$

Figure 3:
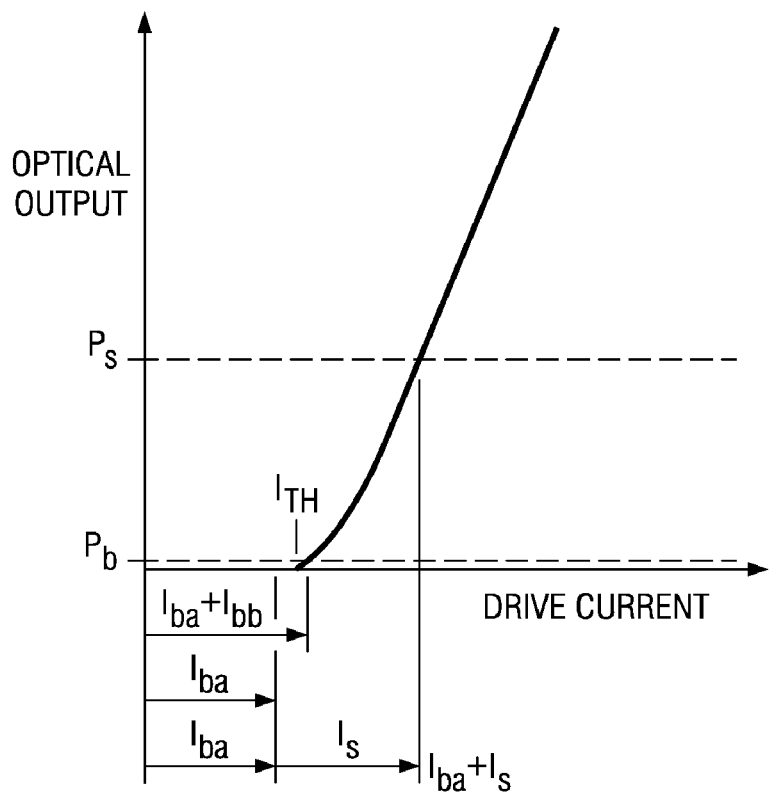
FIG. 3 is a diagram illustrating an operation of the light-emitting element driver in the embodiment.

The main feature is as follows: by appropriate selection of reference voltage $V_{A1}$, current mirror ratio N of current mirror circuit 24, and resistance $R_{26}$ of monitor resistor 26, it is possible to set optical output $P_b$ of laser diode 10 in bias APC to any desired value. Specifically, by selecting a small value for $V_{A1}$, and large values for N and $R_{26}$, as shown in FIG. 3, $P_b$ is set to a value as close to zero as possible, and the drive current corresponding to said $P_b$, that is, temporary bias current $I_b$ ($I_{ba}+I_{bb}$) can be set to a value slightly smaller than threshold current $I_{TH}$.

Then, in bias current supply circuit 12, on/off switch 70 is turned off, and resistor 68 is electrically cut off from node ND. As a result, in voltage-current converter 38, auxiliary bias current component $I_{bb}$ disappears, and the drive current $I_b$ becomes only main bias current $I_{ba}$ instead of ($I_{ba}+I_{bb}$) or the a sum of main bias current $I_{ba}$ and auxiliary bias current component $I_{bb}$. Here, there is the aforementioned relationship of $I_{bb}=KI_{ba}$, and, if the resistances of resistors 66, 68 are $R_{66}$, $R_{68}$, $K=R_{66}/R_{68}$. That is, by selecting resistances $R_{66}$, $R_{68}$ of resistors 66, 68, the proportion of auxiliary bias current component $I_{bb}$ with respect to main bias current $I_{ba}$ can be set as desired. That is, because the value has been set very near threshold current $I_{TH}$ in the stage of temporary bias current ($I_{ba}+I_{bb}$), an appropriately small value for the value of proportionality constant K can be selected. In this way, main bias current $I_{ba}$ obtained by subtracting auxiliary bias current component $I_{bb}$ from temporary bias current ($I_{ba}+I_{bb}$) can be made essentially equal to or extremely close to threshold current $I_{TH}$.

The switching current setting mode is used to set or reset switching current $I_s$ with respect to laser diode 10 on the side of switching current supply circuit 14. Usually, this mode is used after the bias current setting mode is used. When the switching APC mode is executed, switch 25 is turned to the side of terminal s, and photodiode 22 is connected to monitor voltage generator 42 on the side of switching current supply circuit 14. With bias current supply circuit 12, main bias current $I_{ba}$ established in the bias current setting mode continues to be supplied to laser diode 10. Said switching circuit 60 is forced to stay on.

In order to start the switching current setting mode, S/H circuit 34 is switched to sampling mode. Photocurrent $I_{PD}$ flowing through photodiode 22 corresponding to the light emitted from laser diode 10 is converted by monitor voltage generator 42 into monitor voltage $V_{M2}$, which is equal to $R_{42}*nI_{PD}$. Corresponding to the difference between said monitor voltage $V_{M2}$ and reference voltage $V_{A2}$, error voltage $V_{E2}$ is output from comparator 54 and sampled by S/H circuit 56. Output voltage $V_{SH2}$ of S/H circuit 56 is converted into current by voltage-current converter 58. The current generated by voltage-current converter 58, that is, switching current $I_s$, is supplied through switching circuit 60, which is on, and current adder 16 to laser diode 10. Said laser diode 10 is driven by drive current ($I_{ba}+I_s$), that is, the sum of main bias current $I_{ba}$ from bias supply circuit 12 and switching current $I_s$ from switching current supply circuit 14. Here, main bias current $I_{ba}$ is a fixed current set in the aforementioned bias current setting mode.

In this way, in switching current supply circuit 14, particularly closed-loop circuit 44, the feedback operation of switching APC is performed, where switching current $I_s$ varies so that monitor voltage $V_{M2}$ comes to equal reference voltage $V_{A2}$. Due to this feedback operation, the steady state of $V_{M2}=V_{A2}$ is reached, the drive current ($I_b+I_s$) converges to a constant value, and switching current $I_s$ also converges to a constant value. In this way, when S/H circuit 54 is switched to hold mode at a prescribed time after the start of switching APC mode, drive current ($I_b+I_s$) and switching current $I_s$ are held to constant values that correspond to prescribed optical output $P_s$, to be explained below.

If the optical output of laser diode 10 is $P_s$ and photocurrent $I_{PD}$ of photodiode 12 is $I_{PDS}$ when the feedback operation of the switching APC reaches steady state Equation 4 holds.

$$P_S = \alpha * I_{PDS} \quad (4)$$

Also, as will be explained below, Equation 5 follows from said equation of the steady state $V_{M2}=V_{A2}$.

$$V_{A2} = V_{M2} = R_{48} * n I_{PDS} \quad (5)$$

Equation 6 follows from said Equations 4, 5.

$$P_s = \alpha * I_{PDS} = \alpha * V_{A2} / (n * R_{48}) \quad (6)$$

From Equation 6, one can see that optical output $P_s$ of laser diode 10 in switching APC mode can be set to any desired value by appropriate selection of reference voltage $V_{A2}$, current mirror ratio n of current mirror circuit 46 and resistance $R_{48}$ of monitor resistor 48. In the switching current setting mode, switching current $I_s$ and drive current ($I_b+I_s$) are determined to ensure constant optical output when laser diode 10 emits light in the normal operating mode, the set optical output $P_s$ for use in switching APC is equal to the optical output as the target value in normal operating mode, and is a so-called fixed value.

The importance of Equation 6 is its relationship to Equation 3. That is, from said Equations 3 and 6, Equation 7 can be derived.

$$P_b/P_S = V_{A1}*(n*R_{48})/V_{A2}*(N*R_{26}) \quad (7)$$

In Equation 7, by appropriately selecting reference voltages $V_{A1}$ and $V_{A2}$, current mirror ratios N, n of current mirror circuits 18, 46, and resistances $R_{26}$, $R_{48}$ of monitor resistors 26, 48, it is possible to set the ratio of variable value $P_b$ to standard value $P_s$ to a minimum value (that is, $P_b$ is set as close to zero as possible). For example, if $V_{A1}$=70 mV, $V_{A2}$=1.4V, N=5, n=1, $R_{26}$=5 kΩ, $R_{48}$=1 kΩ, the value on the right-hand side of Equation 7 becomes:

$$P_b/P_s = 0.07 * 1 * 1000 / 1.4 * 5 * 5000 = 1/500 \quad (8)$$

If optical output P of laser diode 10 is converted into photocurrent $I_{PD}$ of photodiode 22, which is proportional to said optical output, and photocurrent $I_{PDS}$ flowing through photodiode 22 in the switching current setting mode is 2 mA in bias current setting mode, bias current $I_b$ is set such that a photocurrent $I_{PDb}$ of 4 μA, i.e., 1/500 of $I_{PDS}$ flows through photodiode 22. Of course, the ratio of $P_b/P_s$=1/500 is just an example, and another ratio, such as 1/1000 or 1/5000 may also be used.

As explained above, in the switching current setting mode, switching current $I_s$ for laser oscillation at nominal optical output $P_s$ of laser diode 10 is established and held by switching current supply circuit 14. Then, the process goes to the nominal operating mode.

In normal operating mode, by means of bias current supply circuit 12 and switching current supply circuit 14, bias current $I_b$ and switching current $I_s$ that are set or reset in said bias current setting mode and switching current setting mode are output, and switching circuit 60 performs the switching operation corresponding to input signal SC. That is, when input signal SC is at the L level, switching circuit 60 cuts off switching current $I_s$. In this case, laser diode 10 is driven only by bias current $I_b$ from bias current supply circuit 12, and it is set to the standby state immediately before laser oscillation (light emission). Then, when input signal SC is at the H level, switching current $I_s$ from switching current supply circuit 14 flows through switching circuit 60, and said switching current $I_s$ is added to switching current $I_b$ by current adder 16, and the sum of currents ($I_b+I_s$) acts as the drive current to drive laser diode 10 to emit light with nominal value optical output $P_s$.

In this embodiment, even when there are variations in the drive current versus optical output characteristics due to manufacturing differences between individual laser diodes or variations in ambient temperature and changes over time, as explained above, the bias current setting mode is executed, so that it is possible to automatically set or reset bias current $I_b$ to be essentially identical to or very close to threshold current $I_{TH}$ of said laser diode 10, and, at the same time, after the bias current setting mode is used, the aforementioned switching current setting mode is executed so that it is possible to automatically set or reset switching current $I_s$ for generating a laser beam with nominal optical output $P_s$ from laser diode 10.

Figure 4:
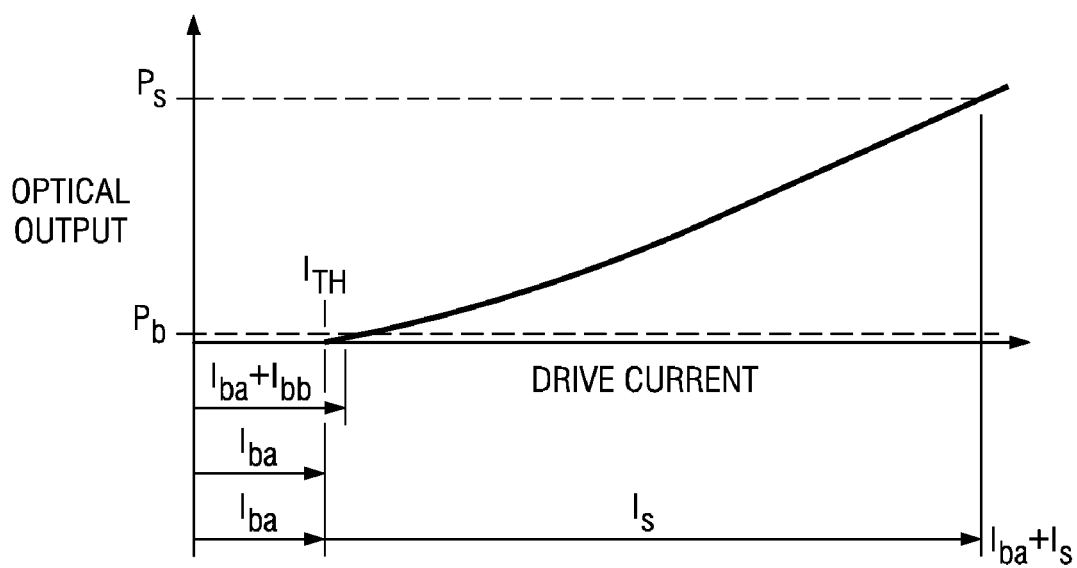
FIG. 4 is a diagram illustrating an operation of the light-emitting element driver in the embodiment.

Consequently, for example, even when the drive current versus optical output characteristics of the laser diode varies from that which is shown in FIG. 3 to that which is shown in FIG. 4, with each set of characteristics, it is possible to automatically set or rest bias current $I_b$ and switching current $I_s$ with high stability and precision.

Specifically, in the bias current setting method in this embodiment, at the point where optical output P of laser diode 10 and photocurrent $I_{PD}$ of photodiode 22 asymptotically approach, that is, at the smallest possible value above threshold current $I_{TH}$, because temporary bias current ($I_{ba}+I_{bb}$) is determined using the bias APC, the setting precision does not depend on the variations in the drive current versus optical output characteristic curve.

Figure 5:
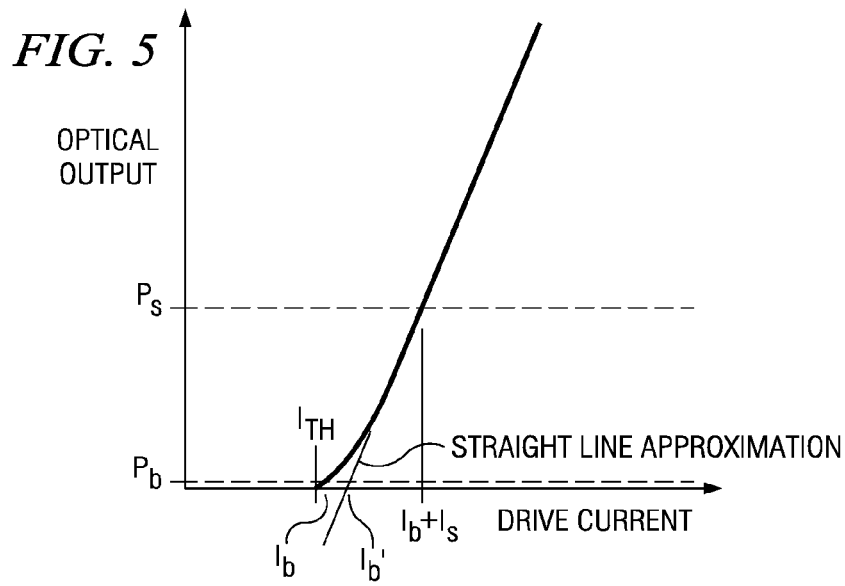
FIG. 5 is a schematic diagram illustrating a comparison between the precision of the bias current in the embodiment and the precision of the bias current in the prior art.
Figure 6:
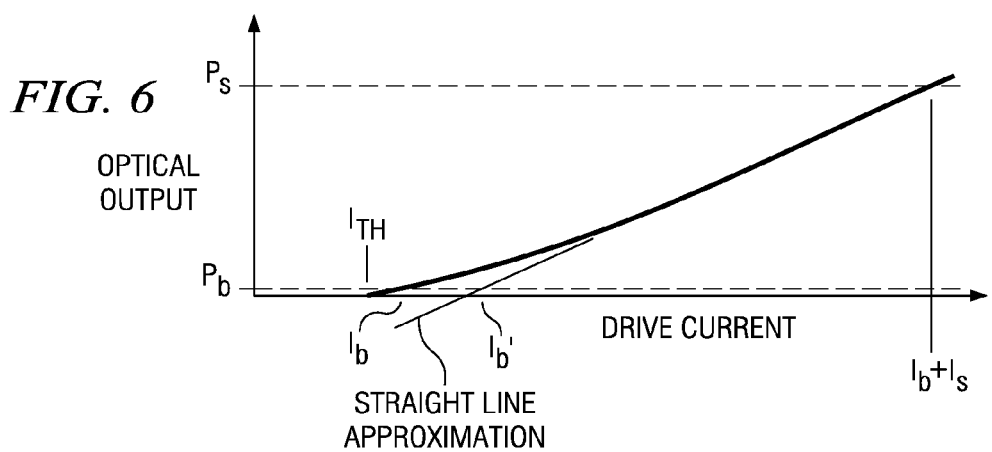
FIG. 6 is a schematic diagram illustrating a comparison between the precision of the bias current in the embodiment and the precision of the bias current in the prior art.
Figure 7:
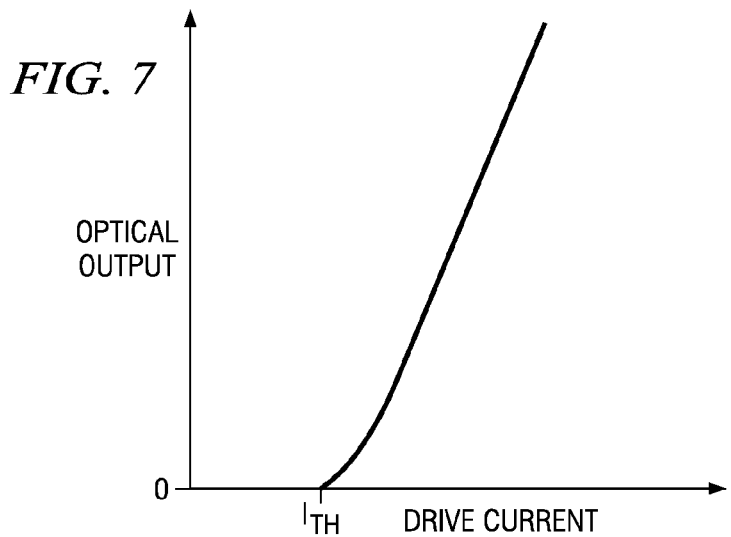
FIG. 7 is a diagram illustrating the drive current versus optical output characteristic curve of the laser diode.

This can be understood at a single glance by comparing the straight line approximation method shown in FIGS. 5 and 6. In the straight line approximation method, the drive current versus optical output characteristic curve is approximated by a straight line, and the point of intersection $I_b'$ of the straight line to the abscissa (current axis) with optical output of zero is computed, and it is taken as the theoretical threshold current value $I_{TH}$. However, because the curve is only approximately represented by a straight line, the precision will inevitably be poor, and theoretical value $I_b'$ tends to be determined at a nearby point that significantly exceeds the actual threshold current $I_{TH}$. Even when this error is adjusted by means of an offset, since the error is large, it is difficult to find the optimum offset value. As shown in FIGS. 5 and 6, as the drive current versus optical output characteristic curve becomes less steep, the problem cannot be handled with an offset.

Also, in this embodiment, with the bias current setting method explained above, it is possible to set a high-precision bias current $I_b$ by merely performing a single bias APC cycle for each operating point on said drive current versus optical output characteristic curve, the circuit constitution is simple, and the processing time is very short. Here, compared to the straight line approximation method of the prior art, it is necessary to perform plural APC cycles for the plural operating points on the drive current versus optical output characteristics, and complicated computations are required to determine theoretical value $I_b'$. As a result, the circuit constitution would be complicated and larger in scale, and the processing time longer.

Usually, when bias current setting and switching current setting are performed successively at one time, the shorter the time that is required for setting the bias current, the shorter will be the time required for setting the switching current, as well as the overall setting, and it is possible to quickly reset the inherent normal operating mode. This reduction of the time required to set the bias current in this embodiment is a major advantage in applications (such as to laser printing heads, etc.) where it is difficult to allow a long time for the setting mode.

Also, in this embodiment, when the offset is performed from the temporary bias current ($I_{ba}+I_{bb}$) set by the bias APC to main bias current $I_{ba}$ approximated by actual threshold current $I_{TH}$, not only is on/off switch 70 turned off, but no computations at all are required. As the temporary bias current ($I_{ba}+I_{bb}$) itself corresponds to the actual threshold current $I_{TH}$, it is possible to have a constitution without voltage-current converter 38 that generates auxiliary bias current component $I_{bb}$.

Also, in said embodiment, all transistors are bipolar transistors, so that the operating speed of the entire circuit is higher. However, it is also possible to use MOS transistors for some or all of the transistors. Also, although the driver of the present invention is particularly suited for applications for driving laser diodes, it may also be applied to driving other current injection type light-emitting elements.

While the invention has been particularly shown and described with reference to preferred embodiments thereof it is well understood by those skilled in the art that various changes and modifications can be made in the invention without departing from the spirit and scope of the invention as defined by the appended claims.

The invention claimed is:

1. A laser diode driver comprising:
    a photodiode for converting the optical output of a laser diode into current;
    a first monitor voltage generator that generates a first monitor voltage with a magnitude equal to the product of the current flowing through said photodiode and a first coefficient;
    a first closed-loop circuit that supplies a bias current to the laser diode such that said monitor voltage becomes equal to a first reference voltage corresponding to the first optical output reference value selected for setting the bias current of said laser diodes;
    a second monitor voltage generator that generates a second monitor voltage with a magnitude equal to the product of the current flowing through the photodiode and a second coefficient;
    a second closed-loop circuit that supplies a switching current to the laser diode such that the second monitor voltage becomes equal to a second reference voltage corresponding to the second optical output reference value selected for setting the switching current of said light-emitting element; and
    a switch circuit for connecting the photodiode to the first monitor voltage generator in a first mode and to the second monitor voltage generator in a second mode.

2. The laser diode driver described in claim 1, wherein the first mode for setting said bias current, said second closed-loop circuit is disconnected and the first closed-loop circuit is used to perform a feedback operation, and the difference obtained by subtracting a prescribed proportion of the offset portion from the first current at steady state in said first closed-loop circuit is held as the bias current.

3. The laser diode driver described in claim 2, wherein the second mode for setting said switching current performed after the end of said first mode, while the bias current is fed in the hold state by the first closed-loop circuit, a feedback operation is performed by the second closed-loop circuit, and the current at steady state in the second closed-loop circuit is held as said switching current.

4. The laser diode driver described in claim 3, wherein the third mode when the laser diode is driven to emit light after the end of the second mode, the bias current from the first closed-loop circuit in the hold state is continuously supplied to the laser diode, and the switching current from the second closed-loop circuit in the hold state is added to the bias current corresponding to the prescribed input signal, and the sum is supplied to the laser diode.

5. The laser diode driver described in claim 1, wherein said first monitor voltage generator comprises a first monitor resistor through which flows a current identical to that flowing through the photodiode, or a current proportional to the current with a first ratio, wherein the voltage drop across the first monitor resistor is used as the first monitor voltage.

6. The laser diode driver described in claim 5, wherein the first ratio is one or more.

7. The laser diode driver described in claim 5 wherein said first monitor voltage generator has a first transistor connected in series with the photodiode, and a second transistor that together with the first transistor forms a current mirror circuit with a current mirror ratio corresponding to the first ratio, and the first monitor resistor and the second transistor are connected in series.

8. The laser diode driver described claim 1 wherein the first closed-loop circuit comprises the following parts:
    a first comparator that compares the monitor voltage to the first reference voltage and generates an error voltage corresponding to the difference between them,
    a first sample-and-hold circuit that samples and holds the error voltage from the first comparator for performing a feed back operation in which the first sample-and-hold circuit is switched to sampling mode, and when said feedback operation is stopped, the first sample-and-hold circuit is switched to hold mode,
    a first bias current component generator that generates a first bias current component corresponding to the output voltage of the first sample-and-hold circuit,
    a second bias current component generator that generates a second bias current component corresponding to the output voltage of the first sample-and-hold circuit, wherein after the feedback operation is stopped, the second bias current component that is supplied from the second bias current component generator to the first current adder is cut off;
    and a first current adder that adds the first bias current component and the second bias current component to generate the first current.

9. The laser diode driver described in claim 8, wherein the first closed-loop circuit comprises:
    a third transistor, one terminal of which is connected to a voltage terminal of the first reference power source and the other terminal of which is connected to the first node,
    a first feedback resistor connected between the first node and the voltage terminal for the second reference power source for sourcing said first bias current component,
    a second feedback resistor connected in parallel with the first feedback resistor and between the first node and the voltage terminal of the second reference power source for sourcing the second bias current component,
    an on/off switch connected in series with the second feedback resistor between the first node and the voltage terminal of the second reference power source, a differential amplifier, which has a first input terminal connected to the output terminal of the first sample-and-hold circuit, a second input terminal connected to the first node, and the control terminal of the third transistor, and which amplifies the difference between the output voltage of said first sample-and-hold circuit and the node voltage obtained at the first node, a current mirror composed of the third transistor and a fourth transistor connected in series with the laser diode;

the first bias current component generator that is composed of the third transistor, the first feedback resistor, and the differential amplifier;

the second bias current component generator that is composed of the third transistor, the second feedback resistor and the differential amplifier;

wherein, in the first mode, when said feedback operation is performed, the switch is turned on;

and, in the first mode, when the feedback operation not performed, the switch is turned off.

10. The laser diode driver described claim 1 wherein the second monitor voltage generator comprises a second monitor resistor through which flows the same current as that which flows through the photodiode, or a current proportional to the current at the second ratio, wherein the voltage drop across the second monitor resistor is used as the second monitor voltage.

11. The laser diode driver described in claim 10, wherein the second ratio is one.

12. The laser diode driver described in claim 9 wherein the second monitor voltage generator comprises a fifth transistor connected in series with the photodiode, and a second transistor that, together with the fifth transistor, forms a third current mirror circuit with a current mirror ratio corresponding to the second ratio, and the second monitor resistor and the second transistor are connected in series.

13. The laser diode driver described in claim 1 wherein the second closed-loop circuit comprises:

a second comparator that compares the monitor voltage to the second reference voltage and generates an error voltage corresponding to the difference between them, a second sample-and-hold circuit that samples and holds the error voltage from the second comparator, and a switching current generator that generates a switching current corresponding to the output voltage of the second sample-and-hold circuit;

wherein said second mode, when the feedback operation is performed, the second sample-and-hold circuit is switched to sampling mode, and when the feedback operation is not performed, the second sample-and-hold circuit is switched to hold mode.

14. The laser diode driver described in claim 1 wherein a switch for selective connection of said photodiode to said first or second monitor voltage generator.

15. The laser diode driver described in claim 1 wherein first coefficient is larger than said second coefficient.

16. The laser diode driver described in claim 9 wherein transistors are bipolar transistors.

17. The laser diode driver described in claim 2, wherein said first monitor voltage generator comprises a first monitor resistor through which flows a current identical to that flowing through the photodiode, or a current proportional to the current with a first ratio, wherein the voltage drop across the first monitor resistor is used as the first monitor voltage.

18. The laser diode driver described claim 2 wherein the second monitor voltage generator comprises a second monitor resistor through which flows the same current as that which flows through the photodiode, or a current proportional to the current at the second ratio, wherein the voltage drop across the second monitor resistor is used as the second monitor voltage.

19. The laser diode driver described in claim 2 wherein the second closed-loop circuit comprises:

a second comparator that compares the monitor voltage to the second reference voltage and generates an error voltage corresponding to the difference between them, a second sample-and-hold circuit that samples and holds the error voltage from the second comparator, and a switching current generator that generates a switching current corresponding to the output voltage of the second sample-and-hold circuit;

in said second mode, when the feedback operation is performed, the second sample-and-hold circuit is switched to sampling mode, and when the feedback operation is not performed, the second sample-and-hold circuit is switched to hold mode.

* * * * *